United States Patent

Noguchi

(10) Patent No.: US 10,978,359 B2
(45) Date of Patent: Apr. 13, 2021

(54) SIC SUBSTRATE EVALUATION METHOD, SIC EPITAXIAL WAFER MANUFACTURING METHOD, AND SIC EPITAXIAL WAFER

(71) Applicant: SHOWA DENKO K.K., Tokyo (JP)

(72) Inventor: Shunsuke Noguchi, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/544,998

(22) Filed: Aug. 20, 2019

(65) Prior Publication Data

US 2020/0083123 A1  Mar. 12, 2020

(30) Foreign Application Priority Data

Sep. 10, 2018 (JP) .............................. JP2018-168954

(51) Int. Cl.
| | |
|---|---|
| H01L 21/66 | (2006.01) |
| H01L 21/02 | (2006.01) |
| G01N 23/2258 | (2018.01) |
| H01L 29/34 | (2006.01) |
| H01L 29/36 | (2006.01) |
| H01L 29/16 | (2006.01) |
| H01L 21/67 | (2006.01) |

(52) U.S. Cl.
CPC ......... *H01L 22/12* (2013.01); *G01N 23/2258* (2013.01); *H01L 21/0243* (2013.01); *H01L 21/0262* (2013.01); *H01L 21/02378* (2013.01); *H01L 21/02529* (2013.01); *H01L 21/67288* (2013.01); *H01L 22/24* (2013.01); *H01L 29/1608* (2013.01); *H01L 29/34* (2013.01); *H01L 29/36* (2013.01)

(58) Field of Classification Search
CPC ... H01L 22/12; H01L 22/24; H01L 21/02378; H01L 21/0243; H01L 21/02529; H01L 29/34; H01L 29/36; H01L 29/1608; H01L 21/67288; H01L 21/0262; G01N 23/2258

See application file for complete search history.

(56) References Cited

U.S. PATENT DOCUMENTS

| | | | |
|---|---|---|---|
| 2012/0280254 A1* | 11/2012 | Muto | H01L 21/02529 257/77 |
| 2015/0168311 A1* | 6/2015 | Seki | G01N 21/9501 356/51 |
| 2019/0040545 A1* | 2/2019 | Nakamura | H01L 29/1608 |
| 2020/0013907 A1* | 1/2020 | Furusho | C30B 25/20 |

FOREIGN PATENT DOCUMENTS

| | | |
|---|---|---|
| JP | 2016-025241 A | 2/2016 |
| JP | 2018-014343 A | 1/2018 |

* cited by examiner

*Primary Examiner* — Selim U Ahmed
*Assistant Examiner* — Evan G Clinton
(74) *Attorney, Agent, or Firm* — Sughrue Mion, PLLC

(57) ABSTRACT

Provided is an SiC substrate evaluation that includes irradiating a first surface of an SiC substrate which is cut out from an SiC ingot with excitation light before an epitaxial film is laminated on the first surface to perform photoluminescence measurement.

1 Claim, 4 Drawing Sheets

SIC SUBSTRATE EVALUATION METHOD, SIC EPITAXIAL WAFER MANUFACTURING METHOD, AND SIC EPITAXIAL WAFER

CROSS-REFERENCE TO RELATED APPLICATION

Priority is claimed on Japanese Patent Application No. 2018-168954, filed Sep. 10, 2018, the content of which is incorporated herein by reference.

BACKGROUND

Field of the Invention

The present disclosure relates to an SiC substrate evaluation method, an SiC epitaxial wafer manufacturing method, and an SiC epitaxial wafer.

Description of Related Art

Silicon carbide (SiC) has a dielectric breakdown electric field one order of magnitude larger and a band gap three times larger than silicon (Si). In addition, silicon carbide (SiC) has a characteristic that a thermal conductivity is approximately three times higher than silicon (Si). Silicon carbide (SiC) is expected to be applied to power devices, high frequency devices, high temperature operation devices and the like.

A device such as a semiconductor using SiC (hereinafter, referred to as an SiC device) is formed in an SiC epitaxial wafer in which an epitaxial film is formed on an SiC substrate. Hereinafter, a wafer before an epitaxial film is formed will be referred to as an SiC substrate, and a wafer after the epitaxial film is formed will be referred to as an SiC epitaxial wafer.

The SiC substrate is obtained by slicing an SiC ingot. The SiC epitaxial wafer includes an SiC substrate and an epitaxial film. The epitaxial film is laminated on one surface of the SiC substrate through chemical vapor deposition (CVD). The epitaxial film serves as an active region of an SiC device.

An Si substrate which is widely used for a semiconductor device can be manufactured with high quality, and an epitaxial film is not required. On the other hand, an SiC substrate has more defects than an Si substrate. The epitaxial film is formed to improve the quality of an SiC device.

Patent Document 1 discloses that the surface of an SiC epitaxial wafer after the formation of an epitaxial film is evaluated using a photoluminescence method.

Patent Document 2 discloses that the surface of an Si substrate is evaluated using a photoluminescence method.

Patent Documents

[Patent Document 1] Japanese Unexamined Patent Application, First Publication No. 2016-25241
[Patent Document 2] Japanese Unexamined Patent Application, First Publication No. 2018-14343

An SiC device may have degraded characteristics (bipolar degradation occurs) when a voltage is applied in a forward direction. It is said that the bipolar degradation is caused by a defect expanded by applying a voltage in a forward direction of the SiC device.

Most defects causing bipolar degradation can be identified by performing photoluminescence measurement of an SiC epitaxial wafer. However, even when a history of the photoluminescence measurement of the SiC epitaxial wafer is confirmed, a causative defect may not be confirmed.

The present disclosure is contrived in view of the above-described problem, and an object thereof is to provide an SiC substrate evaluation method by which a location that may cause a defect in an SiC device can be identified.

A photoluminescence method is a method of irradiating a material with excitation light and measuring light which is emitted when excited electrons return to a ground state. The excitation light excites electrons in the vicinity of the surface of the material. In other words, in the photoluminescence method, it is not possible to identify a defect at a deep position from the surface of an SiC epitaxial wafer which excitation light does not reach. For example, in a case where there is a cause in an SiC substrate before the formation of an epitaxial film, it is not possible to identify a defect even when the SiC epitaxial wafer after the formation of the epitaxial film is evaluated. Consequently, the inventor has found out that the cause of a defect can be traced back to an SiC substrate, as a result of intensive research.

The analysis of an SiC substrate can be performed using, for example, secondary ion mass spectrometry (SLMS). In SIMS, it is possible to measure the concentration of impurities in an SiC substrate. A location where impurities are aggregated locally has a low electrical resistance or a high electrical resistance. In the case of n-type SiC, an electrical resistance is reduced in a case of donor impurities, and an electrical resistance is increased in a case of acceptor impurities. In SIMS, it is possible to identify the aggregation of impurities in an SiC substrate, and the like. On the other hand, SIMS is a destructive inspection, and a sample cannot be measured in a nondestructive manner. Further, in SLMS, a specific destroyed portion is measured. In SIMS, a causative location of a defect may be overlooked in a case where impurities are locally concentrated in a portion other than a measured location.

The inventor has found out that a location that may be the cause of a defect in an SiC device can be identified in a nondestructive manner when a photoluminescence method considered to be unsuitable for an SiC substrate having a large number of defects is applied.

That is, the present disclosure provides the following means in order to solve the above-described problems.

SUMMARY

An SiC substrate evaluation method according to a first aspect includes irradiating a first surface of an SiC substrate which is cut out from an SiC ingot with excitation light before an epitaxial film is laminated on the first surface to perform photoluminescence measurement.

An SiC epitaxial wafer manufacturing method according to a second aspect includes laminating an epitaxial film on the first surface after the first surface of the SiC substrate is evaluated using the SiC substrate evaluation method according to the aspect.

An SiC epitaxial wafer according to a third aspect may include an SiC substrate, and an epitaxial film which is laminated on a first surface of the SiC substrate, in which a region where an intensity of photoluminescence caused by impurities becomes higher than an intensity of photoluminescence caused by an SiC band end is equal to or less than 50% of a total area of the first surface in the first surface of the SiC substrate.

DETAILED DESCRIPTION

Figure 1:
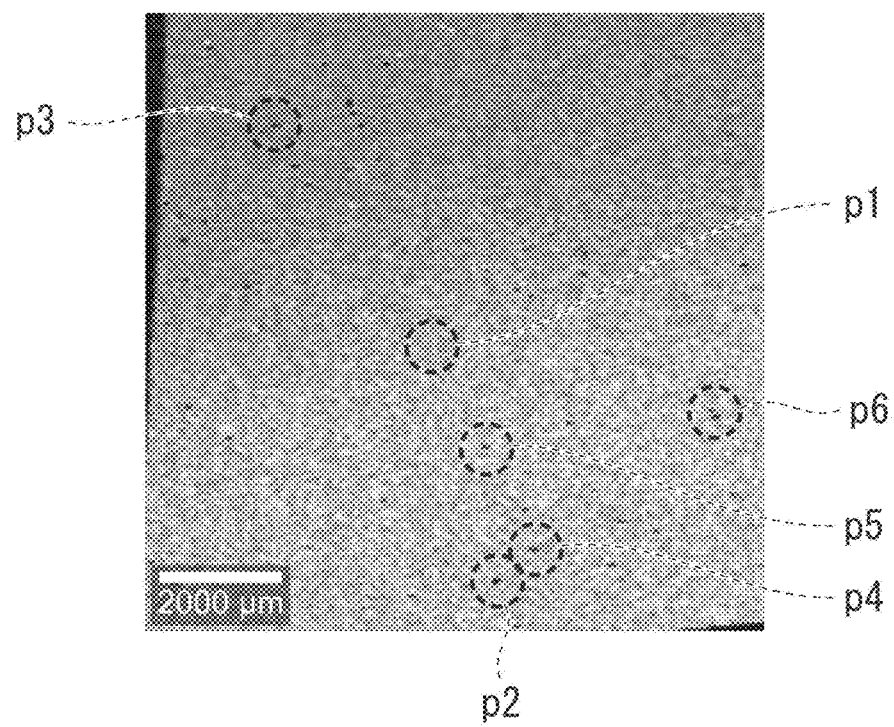
FIG. 1 is a photoluminescence image of a first surface of an SiC substrate.

Hereinafter, the present embodiment will be described in detail with reference to the accompanying drawings as appropriate. In some cases, in the drawings used in the following description, characteristic portions are shown at an enlarged scale for convenience of easy understanding of characteristics, and the dimensional ratios and the like of the respective components are not necessarily the same as the actual ones. In the following description, the materials, dimensions, and the like are merely exemplary examples, do not limit the present disclosure, and can be appropriately modified within a range not departing from the scope of the present disclosure.

"SiC Epitaxial Wafer Manufacturing Method"

An SiC epitaxial wafer manufacturing method according to the present embodiment includes an SiC ingot manufacturing step, an SiC substrate manufacturing step, an SiC substrate evaluation step, and an epitaxial film laminating step.

An SiC ingot is a single crystal of the bulk of SiC. The SiC ingot can be manufactured by a sublimation recrystallization method or the like.

An SiC substrate is manufactured from the manufactured SiC ingot. The SiC substrate is obtained by slicing the SiC ingot. It is preferable that the surface of the SiC substrate be grounded.

Subsequently, a first surface of the SiC substrate is evaluated. The first surface is a surface on which an epitaxial film is laminated in a step to be described later. The first surface is evaluated using a photoluminescence method.

The photoluminescence method is a method of irradiating a material with excitation light and measuring light which is emitted when excited electrons return to a ground state. The first surface of the SiC substrate is irradiated with excitation light having an energy larger than a band gap of SiC, and the intensity of photoluminescence emitted from the SiC substrate is measured. A defect in the SiC substrate, a location where impurities are aggregated, and the like are identified by applying a photoluminescence method to the SiC substrate.

FIG. 1 is a photoluminescence image of a first surface of an SiC substrate. In the photoluminescence image shown in FIG. 1, the first surface of the SiC substrate of 10 mm×10 mm is irradiated with excitation light having an excitation wavelength of 355 nm and a spot diameter of 1 μm at intervals of 50 μm, and light having a wavelength of 440±20 nm and emitted from the SiC substrate is detected. The excitation light is emitted using a semiconductor-excited solid (DPSS) laser. An excitation power density of an excitation laser is set to 650 μW with respect to a spot diameter of 1 μm. A measurement temperature is set to be room temperature (25° C.). The SiC substrate is doped with nitrogen of approximately $1 \times 10^{18}$ atoms/cm$^3$. A portion having a strong black color in FIG. 1 is a portion having a high light emission intensity.

Figure 2:
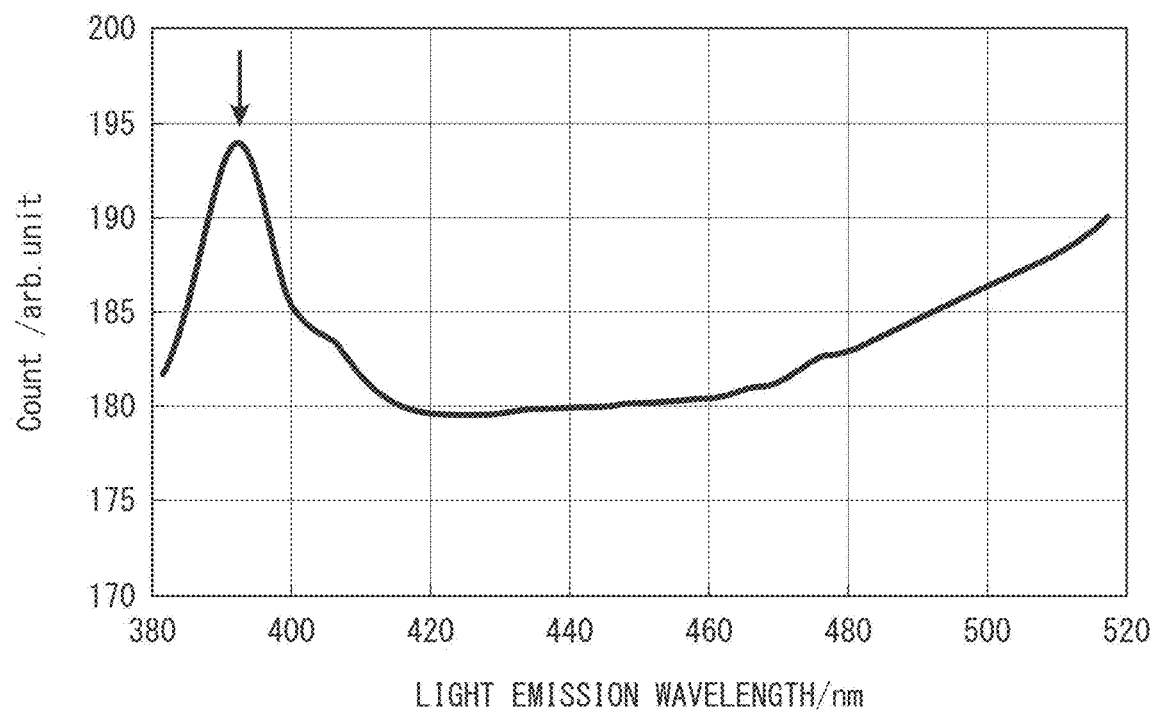
FIG. 2 shows results obtained by measuring the wavelength dependency of a light emission intensity at a measurement point p1 shown in FIG. 1.
Figure 3:
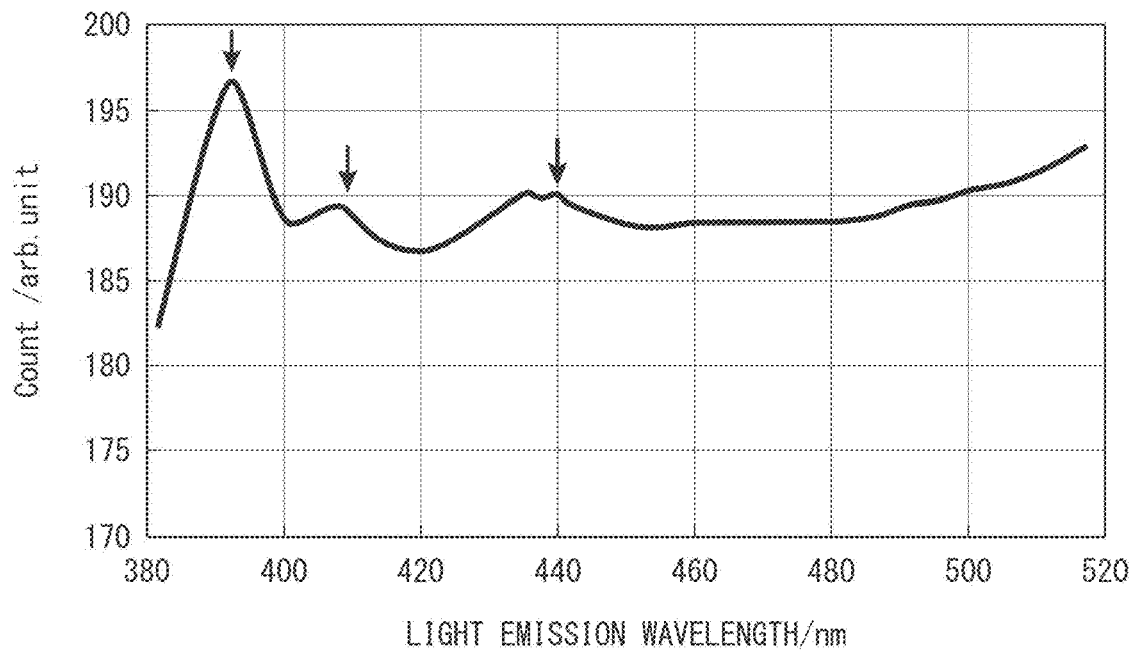
FIG. 3 shows results obtained by measuring the wavelength dependency of a light emission intensity at a measurement point p2 shown in FIG. 1.

FIG. 2 shows results obtained by measuring wavelength dependency of a light emission intensity at a measurement point p1 shown in FIG. 1. FIG. 3 shows results obtained by measuring wavelength dependency of a light emission intensity at a measurement point p2 shown in FIG. 1. In FIG. 2, a strong light emission peak is shown in the vicinity of 390 nm. In FIG. 3, a strong light emission peak is shown in the vicinities of 390 nm, 410 nm and 430 nm. The light emission peak shown in the vicinity of 430 nm in FIG. 3 corresponds to stronger light emission occurs at the measurement point p2 than at the measurement point p1 in FIG. 1.

The light emission peak in the vicinity of 390 nm is derived from band end light emission of 4H—SiC. The measurement point p1 is regarded as a normal portion by a strong peak derived from the band end light emission of 4H—SiC. On the other hand, the measurement point p2 has a light emission peak in the vicinities of 410 nm and 430 nm other than the band end light emission of 4H—SiC. It is considered that these light emission peaks are derived from a defect (including impurities other than intentionally doped impurities). For example, a light emission peak in the vicinity of 430 nm is considered to be a peak derived from one doped with nitrogen and boron. The measurement point p2 is regarded as an abnormal portion.

Figure 4:
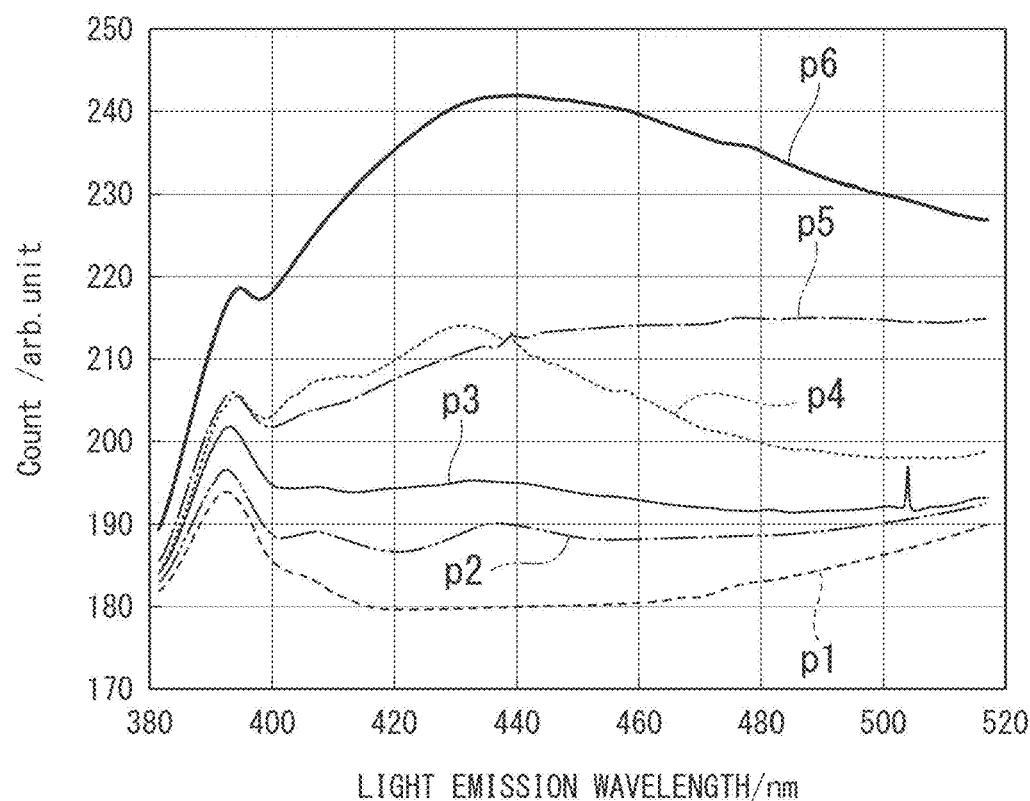
FIG. 4 shows results obtained by measuring the wavelength dependency of light emission intensities at measurement points p1 to p6 shown in FIG. 1.

FIG. 4 shows results obtained by measuring wavelength dependency of light emission intensities at measurement points p1 to p6 shown in FIG. 1. In FIG. 1, all of the measurement points p2 to p6 at which a black spot is observed have a light emission peak other than the vicinity of 390 nm which is derived from the band end light emission of 4H—SiC.

In FIG. 4, a difference between the light emission intensities at the measurement points p1 to p6 is a deviation accompanying measurement conditions and the like. On the other hand, an intensity ratio for each light emission peak at the measurement points p1 to p6 corresponds to an abundance ratio of defects included in the SiC substrate. For example, at the measurement point p4, a light emission intensity of a light emission peak accompanying impurities in the vicinity of 430 nm is higher than a light emission intensity of a light emission peak accompanying the band end light emission of 4H—SiC in the vicinity of 390 nm. The measurement point p4 indicates that there are a large amount of unintended impurities other than doped impurities. It is possible to estimate the amount of existing specific defects by standardizing a light emission peak in each wavelength by a light emission peak in the vicinity of 390 nm.

A photoluminescence method is useful to measure the state of a substrate having a small number of defects. This is because when the number of defects is large, electron-hole pairs formed due to excitation are trapped in the defects, and thus sufficient light emission cannot be obtained.

The number of defects on the surface of the SiC substrate is approximately 1000 pieces to 10000 pieces/cm$^2$. On the other hand, the number of defects on the surface of an epitaxial film of an SiC epitaxial wafer is approximately 10/cm$^2$. The number of defects is reduced in the order of several orders of magnitude by laminating an epitaxial film.

It is considered that a photoluminescence method is useful for an Si substrate or an SiC epitaxial wafer having a small number of defects, but is not useful for an SiC substrate having a large number of defects.

However, as shown in FIGS. 1 to 4, it is confirmed that a location where a defect is present can be identified by using a photoluminescence method also in an SiC substrate.

The quality of SiC substrates is increasing year by year. The intensity of photoluminescence light emitted from an SiC substrate becomes higher as the quality of an SiC substrate becomes higher. When the quality of an SiC substrate is low, photoluminescence light becomes weaker, and thus sufficient light emission is difficult to obtain. The total dislocation density of an SiC substrate is preferably equal to or less than 10000 pieces/cm$^2$, more preferably equal to or less than 8000 pieces/cm$^2$, and further preferably equal to or less than 5000 pieces/cm$^2$. In addition, a total density of impurities included in an SiC substrate is preferably less than $1.0 \times 10^{20}$ atoms/cm$^3$, more preferably less than $5.0 \times 10^{19}$ atoms/cm$^3$, and further preferably less than $1.0 \times 10^{19}$ atoms/cm$^3$. Here, the impurities include impurities, such as N or B, which are intentionally doped as a dopant, a total density of the impurities means an average density of the entire SiC substrate, and a portion locally having a high impurity concentration may be present in the SiC substrate.

Figure 5:
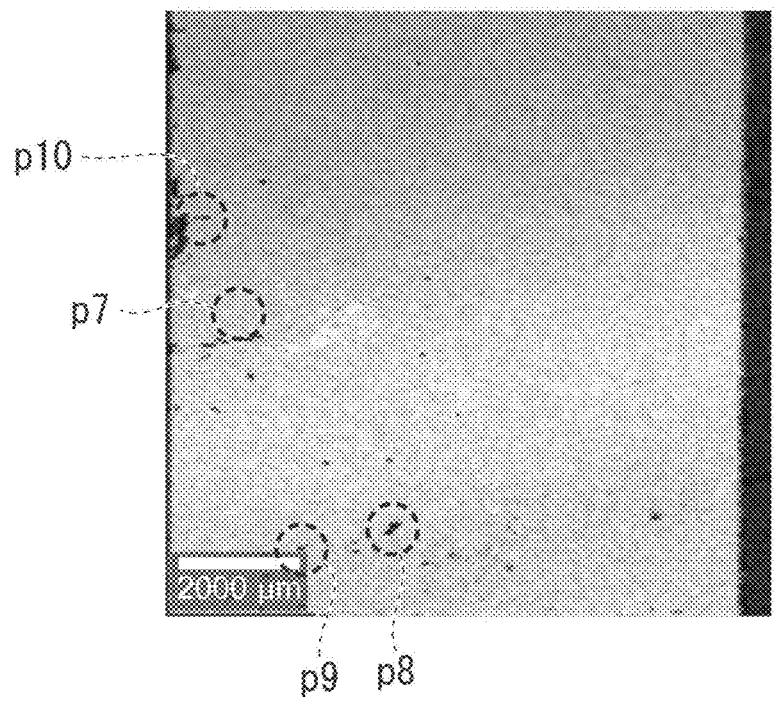
FIG. 5 is a photoluminescence image of the first surface of the SiC substrate.

In addition, FIG. 5 is a photoluminescence image of the first surface of the SiC substrate. The photoluminescence image in FIG. 5 has conditions different from those of the photoluminescence image in FIG. 1 in that an SiC substrate having a different impurity concentration is used. The impurity concentration of intentionally doped nitrogen is approximately $1 \times 10^{18}$ atoms/cm$^3$, which is similar to a condition when the photoluminescence image in FIG. 1 is obtained.

Figure 6:
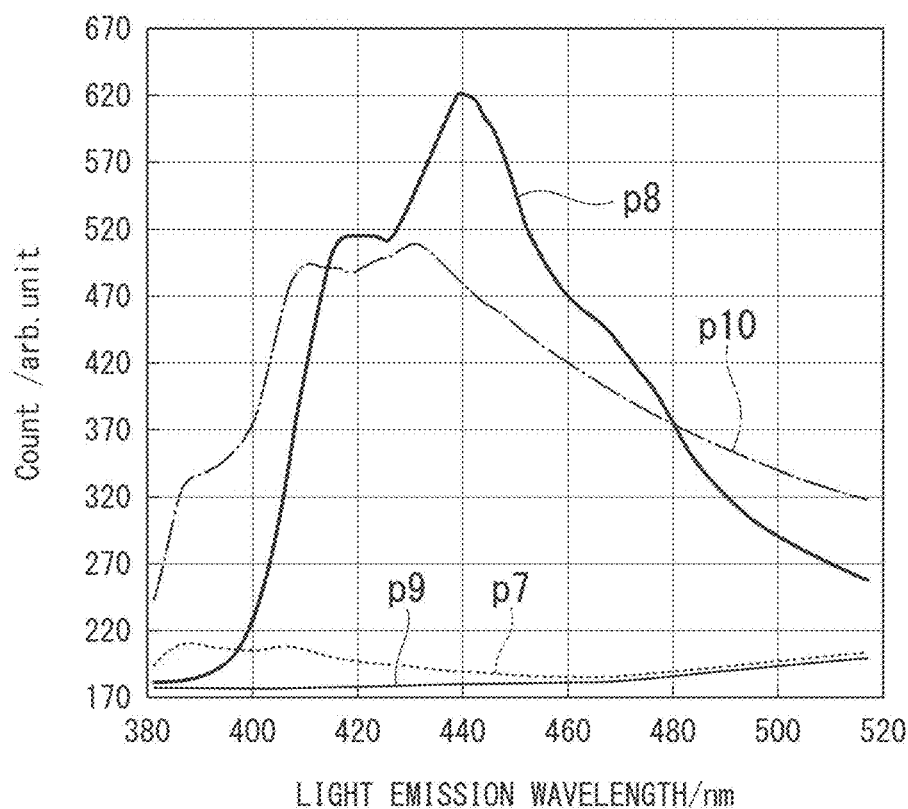
FIG. 6 shows results obtained by measuring the wavelength dependency of light emission intensities at measurement points p7 to p10 shown in FIG. 5.

FIG. 6 shows results obtained by measuring wavelength dependency of light emission intensities at measurement points p7 to p10 shown in FIG. 5. Since the concentration of nitrogen is higher than that of the SiC substrate shown in FIG. 1, a light emission peak accompanying band end light emission of 4H—SiC in the vicinity of 390 nm is hardly confirmed. On the other hand, locations (measurement point p8 to p10) having black spots in FIG. 5 have a light emission peak in the vicinities of 410 nm, 420 nm, 430 nm, 440 nm, and 470 nm. These light emission peaks are derived from a defect (including unintended impurities other than doped impurities). That is, also in an SiC substrate having a high impurity concentration, a location where a defect is present can be identified using a photoluminescence method.

Figure 7:
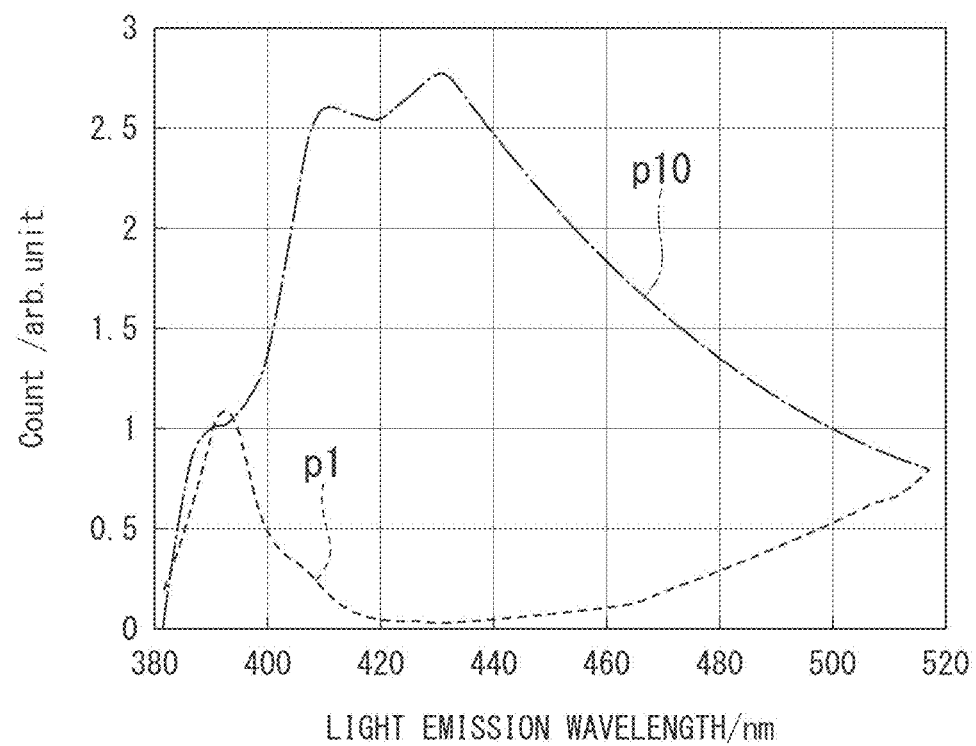
FIG. 7 is a graph in which a light emission spectrum at the measurement point p1 shown in FIG. 1 and a light emission spectrum at the measurement point p10 shown in FIG. 5 are standardized with a light emission intensity of 390 nm.

In addition, FIG. 7 is a graph in which a light emission spectrum at the measurement point p1 shown in FIG. 1 and a light emission spectrum at the measurement point p10 shown in FIG. 5 are standardized with a light emission intensity of 390 nm. A light emission peak in the vicinity of 390 nm is a light emission peak accompanying band end light emission of 4H—SiC. The difference in a light emission intensity of photoluminescence light fluctuates due to a deviation accompanying measurement conditions and the like. Standardization is performed by a common light emission peak of band end light emission of 4H—SiC, and the influence of a deviation of measurement conditions is excluded.

As shown in FIG. 7, the measurement point p10 has a light emission peak in 410 nm and 430 nm. In order to identify the cause of these light emission peaks, a sample used for the measurement in FIGS. 1 and 5 was analyzed by SIMS, and the concentration of nitrogen, the concentration of boron, and the concentration of aluminum were measured.

At the measurement point p1, the concentration of nitrogen was $5 \times 10^{18}$ atm/cm$^3$, the concentration of boron was $8 \times 10^{14}$ atoms/cm$^3$, and the concentration of aluminum was equal to or less than a detection lower limit. On the other hand, at the measurement point p10, the concentration of nitrogen was $6 \times 10^{18}$ atoms/cm$^3$, the concentration of boron was $3 \times 10^{17}$ atoms/cm$^3$, and the concentration of aluminum was $5 \times 10^{16}$ atoms/cm$^3$. The concentration of boron and the concentration of aluminum were higher at the measurement point p10 than at the measurement point p1.

It was confirmed that light emission peaks at 410 nm and 430 nm were caused by boron and aluminum which were not intentionally doped. At the measurement point p10, boron or aluminum aggregated. At a location where impurities aggregate, an electrical resistance locally becomes lower or higher, which may cause a defect in the SiC device.

In photoluminescence measurement, it is preferable to perform spot irradiation on the first surface of the SiC substrate with excitation light. The spot irradiation is performed using, for example, an excitation laser or the like. When spot irradiation with excitation light is performed, it is possible to increase an excitation power density of a surface irradiated with the excitation light. When an excitation power density is high, a light emission intensity obtained from the SiC substrate also increases. As described above, the SiC substrate has a large number of defects, and thus hardly any light emission is obtained. It is also possible to increase the accuracy of detection of impurities in an SiC substrate having a large number of defects by increasing an excitation power density of excitation light. In a case where the entirety of the first surface of the SiC substrate is evaluated, excitation light used for spot irradiation is scanned.

An excitation power density of excitation light is preferably set to equal to or greater than $1.0 \times 10^3$ W/cm$^2$ and equal to or less than $3.0 \times 10^5$ W/cm$^2$, more preferably set to equal to or greater than $3.0 \times 10^3$ W/cm$^2$ and equal to or less than $1.0 \times 10^5$ W/cm$^2$, and further preferably set to equal to or greater than $3.0 \times 10^4$ W/cm$^2$ and equal to or less than $8.0 \times 10^4$ W/cm$^2$. There is a risk that a laminating defect present in the substrate may be expanded when an excitation power density is excessively high, and a light emission intensity sufficient for evaluation is difficult to obtain when an excitation power density is excessively low. In addition, a spot diameter of excitation light is preferably set to equal to or less than 100 µm, more preferably set to equal to or less than 50 µm, and further preferably set to equal to or less than 10 µm.

A temperature at which photoluminescence measurement is performed is, for example, room temperature. A temperature at which photoluminescence measurement is performed is preferably equal to or less than 30° C. and more preferably equal to or less than 0° C. For example, the photoluminescence measurement may be performed at a liquid nitrogen temperature (−196° C.) or the like. When the photoluminescence measurement is performed under a low temperature environment, a light emission intensity obtained is increased, and a peak becomes sharper, whereby it is possible to perform evaluation with higher accuracy.

As described above, it is possible to map a location where a defect is present on the surface of an SiC substrate by the SiC substrate evaluation method according to the present embodiment. It is possible to set the quality or grade of an SiC substrate by mapping a defect.

The quality of an SiC substrate having a smaller number of defects is high. In a first surface of an SiC substrate, a region where the intensity of photoluminescence caused by impurities becomes higher than the intensity of photoluminescence caused by an SiC band end is preferably equal to or less than 50% of the total area of the first surface, is more preferably equal to or less than 30%, and further preferably equal to or less than 10%. Here, the "region where the intensity of photoluminescence caused by impurities becomes higher than the intensity of photoluminescence caused by an SiC band end" is a portion where any peak, other than the vicinity of 390 nm caused by impurities, which has a light emission intensity higher than a light emission intensity in the vicinity of 390 nm caused by band end light emission is observed.

Finally, an epitaxial film is laminated on the first surface of the SiC substrate having been subjected to evaluation. The epitaxial film is formed of SiC. The epitaxial film is laminated using CVD or the like. Regarding the epitaxial film, it is preferable that a region where the intensity of photoluminescence caused by impurities becomes higher than the intensity of photoluminescence caused by an SiC band end be laminated on an SiC substrate which surface is equal to or less than 50% of the total area of a first surface. An SiC epitaxial wafer to be obtained has a small number of defects in the SiC substrate, and thus it is possible to reduce the probability of occurrence of a fault in an SiC device.

As described above, according to the SiC epitaxial wafer manufacturing method of the present embodiment, it is possible to create mapping of a defect at a stage of an SiC substrate. In a case where a fault occurs in an SiC device, it is important to identify the cause of the fault in order to improve the future yield. Having defect mapping of an SiC substrate makes it possible to trace back to the SiC substrate. Therefore, according to the SiC substrate evaluation method and the SiC epitaxial wafer manufacturing method, it is possible to identify a location that may be the cause of the defect in the SiC device.

While preferred embodiments of the invention have been described and shown above, it should be understood that these are exemplary examples of the invention and are not to be considered as limiting. Additions, omissions, substitutions, and other modifications can be made without departing from the spirit or scope of the present disclosure. Accordingly, the invention is not to be considered as being limited by the foregoing description, and is only limited by the scope of the appended claims.

What is claimed is:

1. An SiC epitaxial wafer comprising:
   an SiC substrate; and
   an epitaxial film which is laminated on a first surface of the SiC substrate,
   wherein a region where an intensity of photoluminescence caused by impurities becomes higher than an intensity of photoluminescence caused by an SiC band end is equal to or less than 50% of a total area of the first surface in the first surface of the SiC substrate.

* * * * *